United States Patent [19]
Palczewska et al.

[11] Patent Number: 5,920,972
[45] Date of Patent: Jul. 13, 1999

[54] INTERCONNECTION METHOD FOR A MULTILAYER TRANSDUCER ARRAY

[75] Inventors: Grazyna Palczewska, Seattle; Inessa Persatieva, Renton; Ron Ho, Mercer Island, all of Wash.

[73] Assignee: Siemens Medical Systems, Inc., Iselin, N.J.

[21] Appl. No.: 08/883,778

[22] Filed: Jun. 27, 1997

[51] Int. Cl.[6] .................................................. H01L 41/22
[52] U.S. Cl. .......................................... 29/25.35; 310/334
[58] Field of Search ..................... 29/25.35; 310/334–337

[56] References Cited

U.S. PATENT DOCUMENTS

| | | | |
|---|---|---|---|
| 5,163,436 | 11/1992 | Saitoh et al. | 128/662.03 |
| 5,381,385 | 1/1995 | Greenstein | 367/140 |
| 5,541,468 | 7/1996 | Frey et al. | 310/334 |
| 5,617,865 | 4/1997 | Palczewska et al. | 128/662.03 |
| 5,629,578 | 5/1997 | Winzer et al. | 310/334 |

*Primary Examiner*—Carl E. Hall

[57] ABSTRACT

A method of providing connections to an arrangement of multilayer transducer elements of an ultrasonic transducer array includes patterning an electrically conductive layer on a substrate to define a number of traces and a wide-area continuous region. At least a portion of the substrate is then removed to expose both of the upper and lower surfaces of the wide-area conductive region. The exposed upper and lower surfaces are captured between first and second piezoelectric layers such that the conductive layer electrically contacts both of the piezoelectric layers. The captured wide-area continuous region and at least one of the piezoelectric layers are diced to define the array of transducer elements. The traces that are formed during the patterning step are arranged such that there is a one-to-one correspondence between the traces and the electrodes that are defined by segmenting the wide-area continuous region during the dicing step.

14 Claims, 3 Drawing Sheets

INTERCONNECTION METHOD FOR A MULTILAYER TRANSDUCER ARRAY

BACKGROUND OF THE INVENTION

The invention relates generally to ultrasonic transducer arrays such as those used in transducers for medical imaging, and more particularly to electrical interconnections for the transducer elements of the array.

DESCRIPTION OF THE RELATED ART

In medical applications, ultrasound is a non-invasive and cost-effective approach to acquiring images of a fetus or a human organ. A fetal heartbeat may be monitored by applying principles of Doppler shift to procedural results of directing high frequency acoustic waves (e.g., 3.5 MHz) into the mother and then detecting reflected energy. Within the medical field and other fields that utilize ultrasonic imaging, consistent goals include enhancing resolution and increasing application flexibility.

Resolution is improved by utilizing an array of transducer elements, rather than a single transducer. As is well known in the art, an electric potential applied across a transducer element will induce mechanical strain that converts an electrical signal into ultrasonic energy. The transducer also converts received ultrasonic energy into an electrical signal. By forming a linear array of elements, an ultrasonic beam may be steered or focused. The individual elements of the array may be pulsed at different times to form "wavelets" that combine to form a desired beam. By controlling the phase of the electrical signals that drive the transducer elements, electronic focusing and/or steering can be achieved. Phased arrays having 128 transducer elements are commercially available.

One concern in the design of linear arrays is the approach of providing electrical interconnects between the individual elements and the drive circuitry and the signal-detection circuitry. U.S. Pat. No. 5,617,865 to Palczewska et al., which is assigned to the assignee of the present invention, describes an interconnect scheme for a multi-dimensional ultrasonic array. The array includes a single piezoelectric ceramic layer that is separated in a longitudinal direction into n transducer groups, with each group being separated in a transverse direction into m elements. The interconnection is achieved using a double-sided flex circuit having a flexible layer through which conductive vias extend and are in electrical contact with a particular element. On one side of the flex circuit, a conductive layer is divided into an array of electrodes having a one-to-one correspondence with the elements and with the vias. On the opposite side of the flex circuit, conductive traces are formed from the vias for connection to external drive circuitry and/or signal-detection circuitry. This interconnection scheme operates well for its intended single-piezoelectric layer application.

In addition to using linear arrays to improve ultrasonic imaging, multilayer arrays are utilized. The small size of transducer elements results in a small clamped capacitance and a relatively large electrical impedance. As a consequence of the high impedance elements, a low impedance drive source cannot be effectively utilized. This imposes a limit to the transmit output power. The relatively small clamped capacitance also is associated with an imposed limit. The sensitivity of received signal detection is limited by the capacitive loading of the cables that are conventionally used to connect the ultrasonic transducer array. U.S. Pat. No. 5,629,578 to Winzer et al. describes an acoustic transducer array having integrally packaged conditioning electronics. However, as the number of elements within the transducer array increases, the integration of the conditioning electronics becomes more problematic.

Multilayer transducer arrays have been fabricated to significantly reduce impedance and increase capacitance. For example, multiple ceramic layers of lead zirconate titanate (PZT) may be utilized. The ceramic layers are connected acoustically in series. However, the layers are connected in electrical parallel, resulting in a clamped capacitance that is the sum of the capacitances of all of the layers. In order to achieve the same frequency as a particular single layer transducer element having a capacitance $C_o$, the thickness of each PZT layer in a PZT stack having n layers must be reduced by a factor of n, yielding a total capacitance of $C_n = n^2 \times C_o$. So, the impedance is reduced by a factor of the square of the number of layers, also. Increases in capacitance of more than an order of magnitude can be obtained using multilayer stacks.

Using multiple layers to form an ultrasonic transducer array enhances the performance of the array with respect to both transmission and reception, but increases the complexity of providing interconnections. The flex circuit of the Palczewska et al. patent described above is an interconnect approach that provides advantages related to ease of manufacture and array assembly. However, the substrate material on which the conductive traces and electrodes are patterned and through which the vias are formed creates an acoustic impedance mismatch at the interface of each pair of piezoelectric layers. The mismatch causes reflection at the interface of the adjacent piezoelectric layers, thereby reducing output power. U.S. Pat. No. 5,163,436 to Saitoh et al. describes an alternate interconnect approach for multilayer transducer arrays. Layers of piezoelectric ceramic material, such as PZT, are bonded together with an electrode layer between each pair of piezoelectric layers. The piezoelectric layers and the electrode layers are then cut in the stacking direction by a dicing machine to form an array of transducer elements. One or more flexible print circuits are then soldered to the electrodes in order to provide the required power and signal connections. This approach requires precise alignment of the flexible print circuit to the electrodes, is time consuming, and has significant pitch limitations. As the size of transducer elements in an ultrasonic array continues to decrease with advances in the art, the precise alignment becomes more problematic.

U.S. Pat. No. 5,381,385 to Greenstein also describes an electrical interconnect for a multilayer transducer array. Each transducer element in the array is fabricated to include four via segments, one via segment being at each corner of the transducer element. A first pair of diagonally opposed via segments provides excitation signals to each signal electrode layer of the transducer element. A second pair of diagonally opposed via segments interconnects ground electrode layers within the transducer element. Consequently, a redundant interconnection scheme is achieved. The redundancy provides an increase in manufacturing yield. However, the steps required in order to provide the via segments increases the cost and complexity of fabricating the ultrasonic transducer array.

What is needed is an interconnection approach for fabricating ultrasonic arrays of multilayer transducer elements in a manner that is repeatable, reliable, and cost-effective.

SUMMARY OF THE INVENTION

A method of providing electrical connections to an arrangement of multilayer transducer elements of an ultrasonic array includes patterning electrically conductive material on a flexible substrate to include traces having a correspondence to the arrangement of the transducer elements. At least a portion of the substrate is then removed to expose opposite surfaces of the patterned conductive material. In the preferred embodiment, only a portion of the substrate is removed, with the remaining portion maintaining the pattern of conductive traces intact. The unsupported region of the conductive material is captured between first and second piezoelectric layers of the transducer array such that the electrically conductive material contacts both piezoelectric layers. Thus, any remaining portion of the substrate is beyond the edges of the piezoelectric layers. The performance of the resulting laminated structure is not inhibited by an impedance mismatch which would be created if the flexible substrate were to extend into the interface between the two piezoelectric layers.

In the preferred embodiment, the patterned conductive layer on a substrate initially includes a wide-area continuous region that generally corresponds to the subsequent interface of the conductive materials to the first and second piezoelectric layers. The traces extend from the wide-area continuous region. The removal of the substrate material leaves the wide-area continuous region unsupported. After the piezoelectric layers are brought into contact with the opposed sides of the unsupported region, at least one of the piezoelectric layers and the sandwiched conductive material are diced to define the transducer elements. The wide-area continuous region is simultaneously segmented to form an array of electrodes that corresponds to the array of transducer elements. Since the electrodes and the transducer elements are formed simultaneously, the alignment of the conductive pattern to the piezoelectric layers does not require exacting tolerances. After the wide-area continuous region has been segmented to form the array of electrodes, there is a one-to-one correspondence between the electrodes and the traces that extend to the electrodes. The drive circuitry and signal-detection circuitry can then be connected to the traces.

The substrate is preferably a flexible dielectric material. For example, the polyimide sold by E. I. DuPont de Nemours Company under the federally registered trademark KAPTON may be utilized. The conductive material may be a bimetallic layer, such as copper or nickel having an electroplated gold cap to promote electrical contact and proper adhesion to the ceramic piezoelectric layers. The choice of polarization, poling, impedance matching materials, and the like will depend upon the intended application of the ultrasonic transducer array.

DETAILED DESCRIPTION

Figure 1:
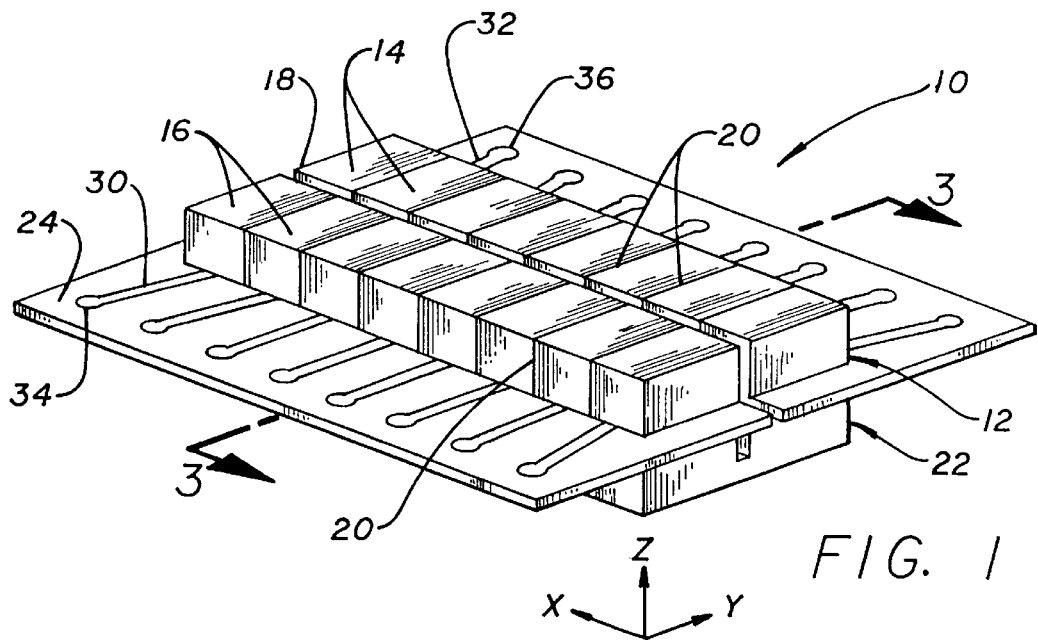
FIG. 1 is a perspective view of an ultrasonic transducer array having multilayer transducer elements and having connectors in accordance with the invention.

With reference to FIG. 1, an ultrasonic transducer array 10 is shown as having a first piezoelectric layer 12 that is divided into a first row of transducer elements 14 and a second row of transducer elements 16. For purposes of illustration and explanation, an X-Y-Z coordinate system is shown in FIG. 1 to define longitudinal, transverse, and vertical directions, respectively. The array is divided in the longitudinal direction by a longitudinal groove 18 between the two rows of elements. Dicing lines 20 extend through the first piezoelectric layer and into a second piezoelectric layer 22 in a transverse direction to divide each row into a number of elements. Techniques for forming the longitudinal groove and the dicing lines are well known in the art.

The illustrated ultrasonic transducer array 10 is shown as having eight elements 14 and 16 in the longitudinal direction and two elements in the transverse direction. However, this is not critical. A phased array of 128 transducer elements in a single longitudinal row is contemplated. The interconnection approach to be described below provides benefits to any arrangement of side-by-side transducer elements of an array.

The second piezoelectric layer 22 is located below the first piezoelectric layer 12. The two piezoelectric layers may be formed of PZT material, but other materials that provide the piezoelectric effect may be utilized. A "piezoelectric layer" is defined as a layer having the ability to efficiently generate mechanical waves in response to an applied electrical field and the ability to generate an electrical signal in response to induced mechanical changes.

Captured between the two piezoelectric layers 12 and 22 is an array of electrodes. The array of electrodes is formed simultaneously with the segmentation of the first piezoelectric layer 12 into the two rows of transducer elements 14 and 16. A wide-area continuous conductive layer is bonded directly to both the first and second piezoelectric layers prior to the formation of the longitudinal groove 18 and the transverse dicing lines 20. A dicing machine cuts through both the first piezoelectric layer and the wide-area conductive material. Using conventional dicing technology, there is an uncertainty of as much as 100 µm (4 mil) in the placement of dicing lines. Because the invention forms the transducer elements and the electrodes simultaneously, the uncertainty does not adversely affect the operation of an individual transducer element. In a less preferred embodiment, rather than bonding a continuous metallization that is then diced to form the electrodes, the electrodes are photolithographically patterned prior to bonding to form the flex circuit. Because the dicing must then be aligned with the prefabricated electrode array, this less preferred embodiment imposes more exacting tolerances with respect to aligning the electrode array to the piezoelectric layers 12 and 22 and with respect to locations of the dicing lines 20.

Figure 2:
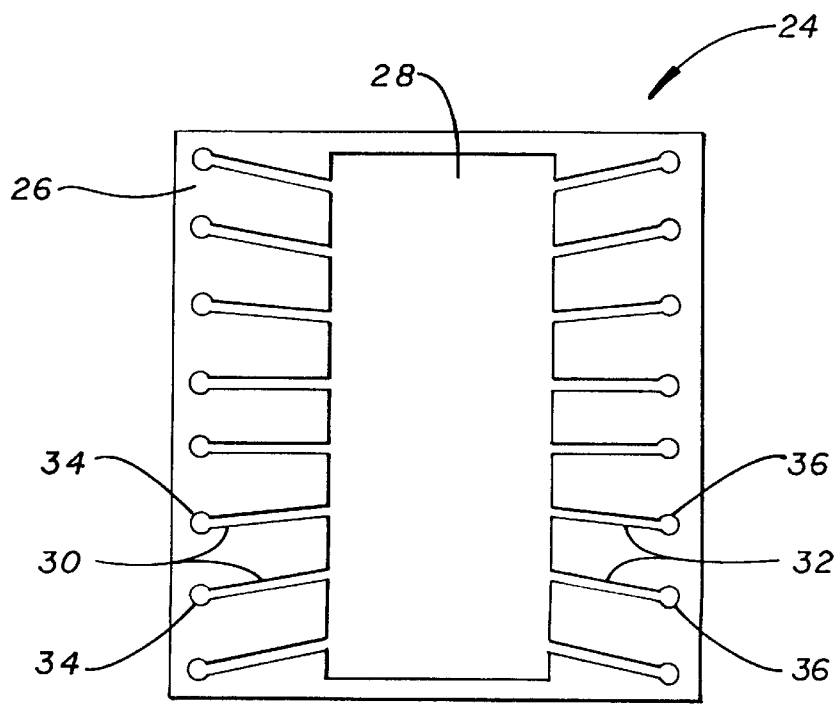
FIG. 2 is a top view of a flex circuit having traces and a wide-area conductive region for fabricating the transducer array of FIG. 1 in accordance with the invention.

Referring now to FIGS. 1 and 2, a first step to providing the electrode array is to form a flex circuit 24 having patterned conductive material on a flexible substrate 26. The conductive material may be applied in any conventional manner, e.g., sputtering, electroplating, and photolithography. In one embodiment, a wide-area continuous region 28 and a number of traces 30 and 32 are formed by photolithographically patterning nickel or copper on the flexible substrate and electroplating gold onto the first metal. Electroplated gold improves electrical contact and adhesion to the piezoelectric layers 12 and 22. As will be explained more fully below, the region of the substrate 26 that lies below the wide-area continuous region 28 is removed in order to allow the conductive material to contact both of the piezoelectric layers. Therefore, the gold cap that promotes electrical contact and adhesion to the piezoelectric layers is preferably formed on both sides of the base layer following the step of removing the region of the substrate.

The flexible substrate 26 is made of an electrically nonconductive material with a suitable dielectric constant. The material should have a high anti-stretch modulus, so as to allow for accurate and permanent positions of the various traces 30 and 32 and the contact points 34 and 36 at the ends of the traces. The preferred material for the flexible substrate is the polyimide sold by E. I. duPont de Nemours Company under the federally registered trademark KAPTON. However, other materials may be used for the substrate 26. The thickness of the substrate is typically in the range of 50–75 µm, but this is not critical. A typical thickness of the bimetallic layer that forms the wide-area region 28, the traces 30 and 32, and the contact points 34 and 36 is approximately 4–6 µm.

After the flex circuit 24 has been fabricated, at least some of the flexible substrate 26 is removed. In the preferred embodiment, a portion of the substrate is left in order to support the traces 30 and 32. However, the substrate region below the wide-area region 28 of the conductive material is etched to expose both major surfaces of the material. The exposed and unsupported region is then bonded to both of the piezoelectric layers 12 and 22.

Figure 3:
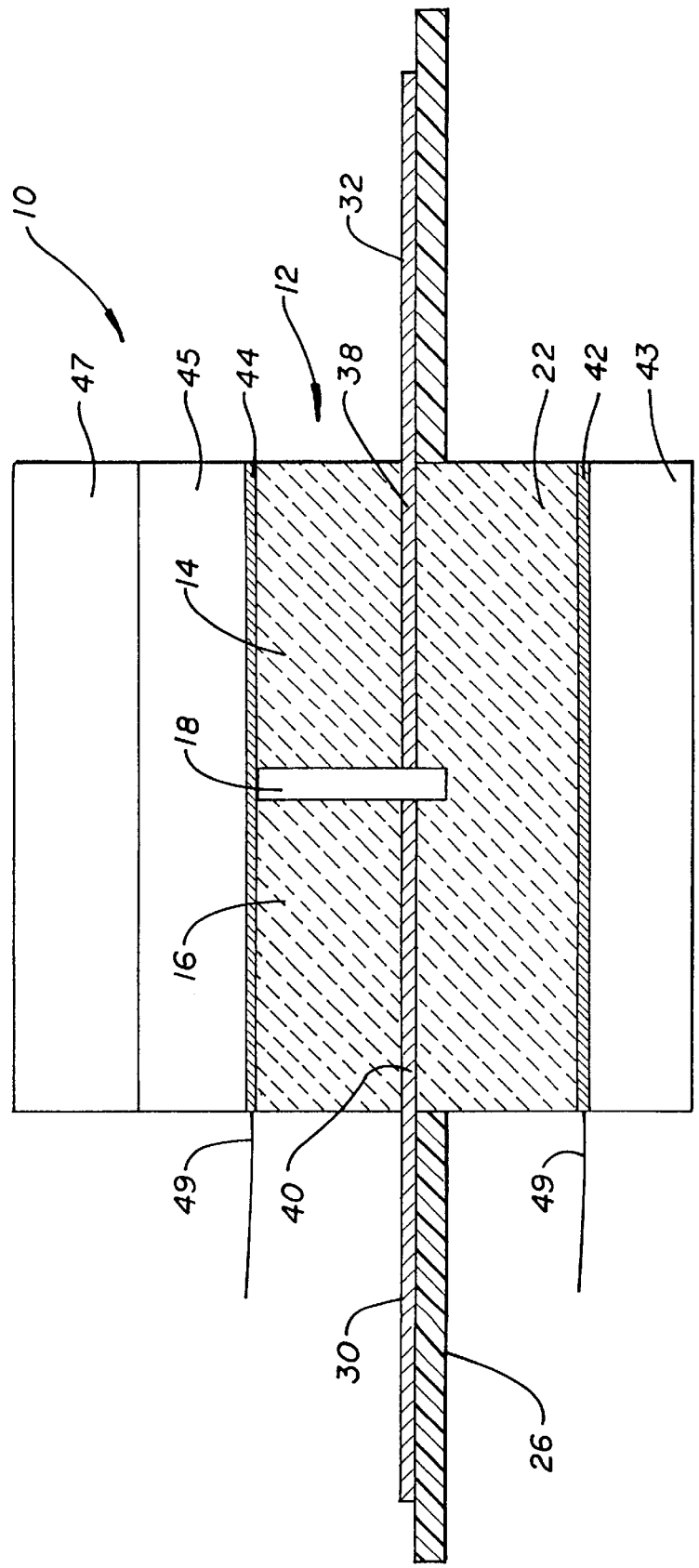
FIG. 3 is a side sectional view of the transducer array of FIG. 1 having a backing layer and impedance matching layers.

The laminated structure is shown in FIG. 3. The longitudinal groove 18 and the dicing lines 20 described with reference to FIG. 1 segment the wide-area continuous region of conductive material into electrodes 38 and 40 that correspond to the resulting array of transducer elements 14 and 16. As shown in FIG. 3, the longitudinal groove 18 does not necessarily extend through the entirety of the lower piezoelectric layer 22. The formation of the electrically isolated electrodes 38 and 40 provides the necessary isolation of transducer elements with respect to the lower piezoelectric layer. It is only necessary that the longitudinal groove and the dicing lines extend through the conductive material that forms the electrodes.

FIG. 3 also shows a ground electrode 42 and a backing layer 43 on a lower surface of the second piezoelectric layer 22. At the upper surface of the first piezoelectric layer 12 are a second ground electrode 44 and two conventional impedance matching layers 45 and 47. Both of the ground electrodes 42 and 44 may be formed of a metallized flexible dielectric material. Optionally, a ground plane electrode may be formed on a substrate, such as a flexible KAPTON substrate, and the substrate may then be etched from that portion of the ground plane electrode that is within the acoustically active area, thereby improving matching. Ground wires 49 are electrically attached to the two ground electrodes. The ground connections are outside of the acoustic path of the transducer. The embodiment of FIG. 3 shows the multilayer transducer array 10 as having only two piezoelectric layers 12 and 22. If more layers are utilized, the backing layer 43 will be connected to the lowermost piezoelectric layer, and each piezoelectric layer will include a ground electrode at one major surface and a flex circuit of FIG. 2 at the opposite major surface. A number of piezoelectric layers may be stacked and electrically activated using the techniques described above for providing double-sided connection of electrodes to two piezoelectric layers. In this stacked arrangement, traces from corresponding layers may be connected using any of the known mass termination technologies.

Conventionally, the backing layer 43 is applied to the lowermost piezoelectric layer. As is well known in the art, the backing layer is formed of material that absorbs ultrasonic waves, thereby reducing reflections from the lower surface of the lowermost piezoelectric layer 22. At the opposite surface of the laminated structure of FIG. 3, i.e., the upper surface of the first piezoelectric layer 12, an electrical connection is provided by the second ground electrode 44 in order to induce the electrical field required for exciting the first piezoelectric layer. Because the ultrasonic waves propagate through the structure for providing the electrical connection, the acoustic impedance is important. The graphite casing is an electrically conductive member that may be fixed at ground potential and in contact with the first and second ground electrodes. Thus, the casing functions as an electrical connection and a protective housing. Optionally, the second impedance matching layer 47 and/or a focusing lens may be added, as is well known in the art.

Figure 4:
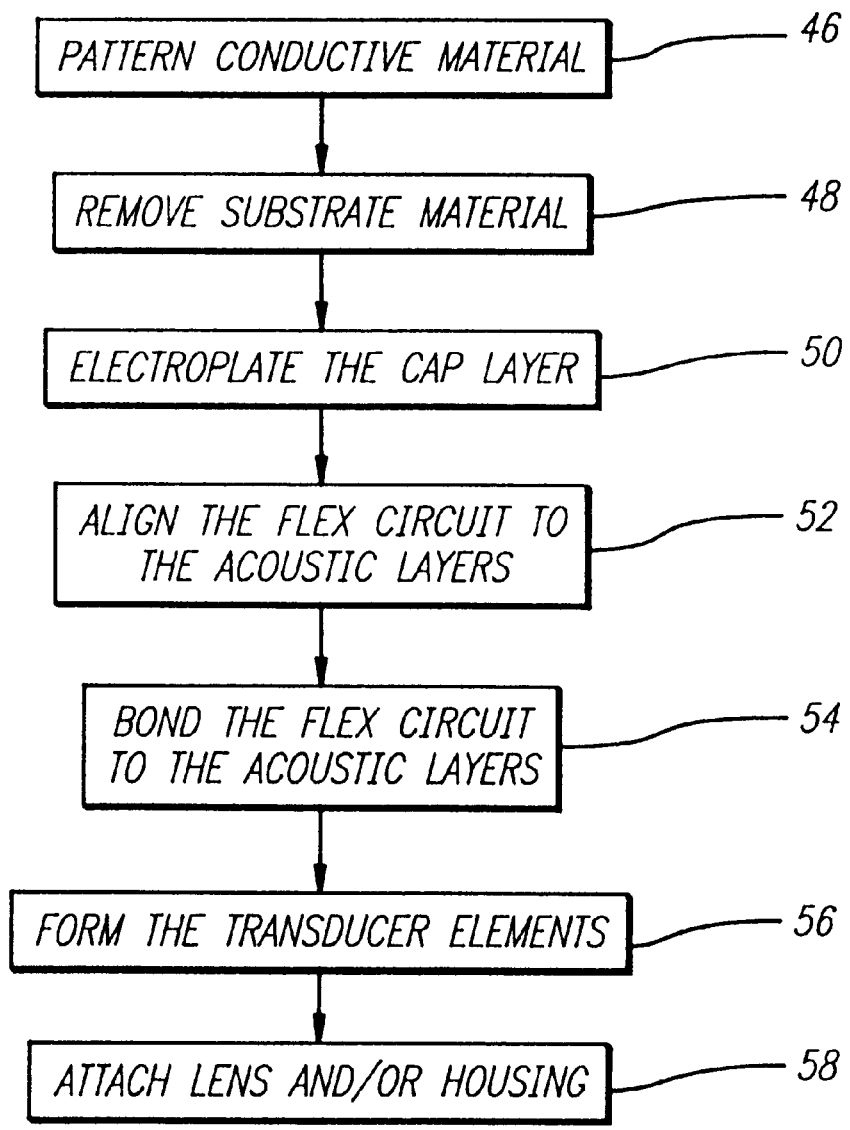
FIG. 4 is an illustration of the process flow for fabricating a transducer array in accordance with the invention.

The fabrication steps for forming the ultrasonic transducer array in accordance with the invention are shown in FIG. 4. The conductive material for defining the electrodes and traces is patterned onto the flexible substrate in step 46. In one embodiment, nickel or copper is photolithographically patterned on a polyimide substrate to form the flex circuit 44 of FIG. 2. The traces 30 and 32 should have a one-to-one correspondence with electrodes that are to be formed by segmenting the wide-area continuous conductive region 28. While the embodiment of FIG. 1 shows two rows of transducer elements 14 and 16, other embodiments are contemplated. A single row of 128 elements may be formed. In the single-row embodiment, all of the traces may extend from the same side of the wide-area conductive region 28. Alternatively, even-numbered traces may extend from one side, while odd-numbered traces extend from the opposite side.

In an embodiment in which there are more than two rows of longitudinally extending transducer elements, the electrodes should be patterned at the same time as the traces, rather than in the step of dicing piezoelectric layers. Traces that extend into electrodes that are not at one of the peripheral edges of the ultrasonic device should be formed during the photolithographic processing. However, the preferred embodiment is one in which the transducer elements and the electrodes are formed simultaneously, as previously noted.

In step 58, at least a portion of the substrate material is removed from supporting the electrically conductive material. All of the substrate material may be chemically etched. However, approximately 0.2 mm of unetched substrate material preferably is left as a border for supporting the traces 30 and 32 of FIG. 2. The border material maintains the alignment of traces and provides structural stability. As a minimum, the portion of the conductive material that is to be captured between the piezoelectric layers 12 and 22 of FIG. 1 should be unsupported by the substrate material after step 48 is implemented.

A cap layer of gold is then electroplated onto the conductive material at step 50. The cap layer should be applied to both sides of the conductive material in order to promote electrical connection and adhesion to the two piezoelectric layers 12 and 22. In some applications, the cap layer is not required.

In step 52, the flex circuit 24 is aligned with the piezoelectric layers 12 and 22. Any portion of the substrate 26 that remains following step 48 should be outside of the two piezoelectric layers. Within embodiments in which the electrodes and the transducer elements are defined simultaneously, the alignment process can be implemented with relaxed tolerances.

The flex circuit having the border substrate or no substrate is then bonded to the piezoelectric layers at step 54. Preferably, the flex circuit has been subjected to a plasma cleaning to prevent any contaminants from inhibiting a proper electrical connection. In the preferred embodiment, the surfaces of the piezoelectric layers are coated with a material (e.g., gold) that further promotes electrical contact with the flex circuit 24. In one embodiment, the contacting surfaces should have sufficient surface roughness to provide a low resistance connection even if the bonding material is a non-conductive epoxy. Conventional bonding materials may be utilized.

In step 56, the individual transducer elements are defined by dicing at least one of the piezoelectric layers and the conductive material of the flex circuit. The ground layers, backing material, housing, and lens are attached at step 58. The implementation of this step is not critical to the invention. For example, a focusing lens is an optional feature. In one embodiment, the resulting laminated structure forms a 3.5 MHz phased array.

An advantage of the invention is that the flex circuit may be fabricated using well known and reliable photolithographic techniques before the fabrication of the array. By removing the portion of the substrate that would otherwise be captured between the piezoelectric layers, the benefits of the substrate can be realized without adverse effects. Electrical contact is provided to both PZT layers using a copper layer having a thickness of approximately 8–10 $\mu$m, which is substantially transparent to the propagation of the acoustic energy. The fabrication scheme is robust, leading to a high manufacturing yield. This is particularly true if the transducer elements and electrodes are defined simultaneously by the dicing technique.

What is claimed is:

1. A method of providing connections to an arrangement of multilayer transducer elements of an ultrasonic transducer array comprising steps of:

forming electrically conductive material on a substrate in a pattern that includes traces having correspondence to said arrangement of multilayer transducer elements;

removing at least a portion of said substrate while maintaining said pattern of conductive material intact, thereby providing an unsupported region of said pattern in which opposed first and second surfaces of said pattern are exposed; and capturing at least a portion of said unsupported region between first and second piezoelectric layers of said transducer array such that said first and second surfaces of said pattern respectively contact said first and second piezoelectric layers.

2. The method of claim 1 wherein said step of removing at least a portion of said substrate includes leaving a peripheral portion of said substrate to retain alignment of said traces, and wherein said step of capturing said unsupported region includes positioning said peripheral portion beyond edges of said first and second piezoelectric layers.

3. The method of claim 1 further comprising a step of defining said transducer elements from said first and second piezoelectric layers, including cutting into at least one of said piezoelectric layers and through said pattern of conductive material.

4. The method of claim 3 wherein said step of forming said electrically conductive material on said substrate includes providing a wide-area region that generally corresponds to said portion of said unsupported region which is captured between said first and second piezoelectric layers, said step that includes cutting through said pattern of conductive material thereby dividing said wide-area region into an array of electrodes.

5. The method of claim 4 wherein said step of forming said electrically conductive material includes forming said traces such that each trace is electrically connected to a single electrode following said step that includes cutting through said pattern.

6. The method of claim 1 wherein said step of forming said electrically conductive material includes depositing a metallic layer on a flexible dielectric substrate.

7. The method of claim 1 wherein said step of forming said electrically conductive material includes patterning a leadframe having said traces extending from opposite sides of a central metallic region that has dimensions generally corresponding to dimensions of said first and second piezoelectric layers, each of said traces being operatively associated with a different transducer element.

8. The method of claim 7 further comprising providing an electrical ground connection along sides of said first and second piezoelectric layers opposite to contact with said unsupported region of said pattern of conductive material.

9. A method of forming an ultrasonic transducer array having multilayer transducer elements comprising steps of:

forming a conductive layer on a flexible substrate of dielectric material such that said conductive layer includes a continuous region having longitudinal and transverse dimensions that substantially correspond to longitudinal and transverse dimensions of said transducer array, said conductive layer having traces extending from said continuous region;

removing said flexible substrate from contact with said continuous region, thereby exposing opposite sides of said conductive layer;

attaching first and second piezoelectric layers to said exposed opposite sides of said conductive layer such that said piezoelectric layers are aligned with and contact said continuous region, thereby forming a laminated structure having said traces extending therefrom; and removing material from said laminated structure to form a plurality of said multilayer transducer elements, including segmenting said continuous region into an array of electrodes.

10. The method of claim 9 wherein said step of attaching said first and second piezoelectric layers includes bonding said piezoelectric layers to said conductive layer.

11. The method of claim 9 wherein said step of removing said flexible substrate includes leaving a peripheral portion of said substrate to maintain said traces in alignment.

12. The method of claim 9 wherein said step of removing material from said laminated structure includes dicing at least one of said piezoelectric layers.

13. The method of claim 9 wherein said step that includes segmenting said continuous region includes providing a one-to-one relationship between said electrodes and said traces.

14. The method of claim 9 wherein said step of removing said flexible substrate from contact with said continuous region is a step of etching a central region of said flexible substrate while leaving outer portions for supporting said traces.

* * * * *